(12) United States Patent
Scholeno (10) Patent No.: US 8,830,679 B2
(45) Date of Patent: Sep. 9, 2014

(54) RECEPTACLE HEAT SINK CONNECTION

(75) Inventor: Michael Scholeno, York, PA (US)

(73) Assignee: FCI Americas Technology LLC, Carson, City, NV (US)

( * ) Notice: Subject to any disclaimer, the term of this patent is extended or adjusted under 35 U.S.C. 154(b) by 294 days.

(21) Appl. No.: 13/438,966

(22) Filed: Apr. 4, 2012

(65) Prior Publication Data

US 2012/0300403 A1 Nov. 29, 2012

Related U.S. Application Data (60) Provisional application No. 61/490,907, filed on May 27, 2011, provisional application No. 61/524,377, filed on Aug. 17, 2011.

(51) Int. Cl.
| | |
|---|---|
| *H05K 7/20* | (2006.01) |
| *H01R 13/6595* | (2011.01) |
| *H01L 23/40* | (2006.01) |
| *A41F 1/00* | (2006.01) |
| *G02B 6/36* | (2006.01) |
| *F21V 5/00* | (2006.01) |
| *H01R 13/00* | (2006.01) |
| *G02B 6/42* | (2006.01) |

(52) U.S. Cl.
CPC .......... *H01R 13/6595* (2013.01); *G02B 6/4201* (2013.01); *H01L 23/4093* (2013.01); *H05K 7/20418* (2013.01); *H05K 7/2049* (2013.01)
USPC .......... 361/711; 361/709; 361/715; 165/80.2; 174/16.3; 24/457; 385/92; 362/580; 439/487; 398/117

(58) Field of Classification Search
CPC .... H05K 7/20–7/2099; H01L 23/34–23/4735; F21V 29/004; F21V 23/06; F21V 29/02; F21Y 2101/02; G02B 6/4292; G02B 6/4246; G02B 6/4201; G02B 6/4204; G02B 6/4277; G02B 6/0006; G02B 6/4298; G02B 6/4296; H01R 13/6595
USPC ............... 361/679.46–679.54, 688–723, 816, 361/818; 165/80.2–80.3, 185; 174/547, 174/548, 16.3; 24/453, 458, 459; 257/718–719; 385/92; 362/580; 439/487; 398/117, 164
See application file for complete search history.

(56) References Cited

U.S. PATENT DOCUMENTS

| | | | | |
|---|---|---|---|---|
| 6,524,134 | B2 | 2/2003 | Flickinger et al. | 439/607 |
| 6,816,376 | B2 * | 11/2004 | Bright et al. | 361/704 |
| 6,980,437 | B2 | 12/2005 | Bright | 361/704 |
| 7,131,859 | B1 * | 11/2006 | Zumbrunnen et al. | 439/487 |
| 7,224,582 | B1 | 5/2007 | Saturley et al. | 361/687 |
| 7,405,931 | B2 | 7/2008 | Saturley et al. | 361/687 |

(Continued)

FOREIGN PATENT DOCUMENTS

WO   WO-2012/019068 A2   2/2012

*Primary Examiner* — Zachary M Pape
(74) *Attorney, Agent, or Firm* — Harrington & Smith (57) ABSTRACT

A receptacle including a shield housing and a heat sink. The shield housing has a first side configured to be connected to a printed circuit board. The housing has an aperture for insertion of a plug of a cable assembly. The heat sink is connected to the first side or an opposite second side of the shield housing. The heat sink has a lateral end section which extends along an exterior of a least one lateral side of the shield housing.

16 Claims, 7 Drawing Sheets

(56) References Cited

U.S. PATENT DOCUMENTS

| | | | |
|---|---|---|---|
| 7,625,223 B1 | 12/2009 | Fogg | 439/92 |
| 7,974,098 B2 | 7/2011 | Oki et al. | 361/715 |
| 8,382,509 B2 * | 2/2013 | David et al. | 439/487 |
| 8,599,559 B1 * | 12/2013 | Morrison et al. | 361/702 |
| 2008/0199187 A1 | 8/2008 | Andersson et al. | 398/164 |
| 2011/0051373 A1 * | 3/2011 | McColloch | 361/709 |

\* cited by examiner

RECEPTACLE HEAT SINK CONNECTION

CROSS REFERENCE TO RELATED APPLICATION

This application claims the benefit under 35 USC 119(e) on U.S. Provisional Patent Application No. 61/490,907 filed May 27, 2011, and U.S. Provisional Patent Application No. 61/524,377 filed Aug. 17, 2011, which are hereby incorporated by reference in their entireties.

BACKGROUND

1. Technical Field

The exemplary and non-limiting embodiments of the invention relate generally to a receptacle and, more particularly, to a plug receptacle having a heat sink.

2. Brief Description of Prior Developments

U.S. Pat. No. 7,625,223, which is hereby incorporated by reference in its entirety, describes a connector system with a floating heat sink. U.S. Pat. Nos. 6,980,437 and 6,816,376, which are also incorporated by reference in their entireties, describe other types of plug receptacles with heat sinks. U.S. Pat. No. 6,524,134, which is hereby incorporated by reference in its entirety, describes a pluggable module and receptacle.

SUMMARY

The following summary is merely intended to be exemplary. The summary is not intended to limit the scope of the claims.

In accordance with one aspect, a receptacle is provided including a shield housing and a heat sink. The shield housing has a first side configured to be connected to a printed circuit board. The housing has an aperture for insertion of a plug of a cable assembly. The heat sink is connected to the first side or an opposite second side of the shield housing. The heat sink has a lateral end section which extends along an exterior of a lateral side of the shield housing.

In accordance with another aspect, a receptacle is provided comprising a shield housing and a heat sink. The shield housing is configured to be connected to a printed circuit board, where the shield housing comprises an aperture for insertion of a plug of a cable assembly, where the shield housing comprises a member with a front section connected to a rear section by a deflectable beam. The heat sink is connected to the front section of the member, where the heat sink is movable on the shield housing by general cantilevered deflection of the deflection beam relative to the rear section In accordance with another aspect, a method comprises connecting a heat sink to a first section of a member of a receptacle shield housing, where the member comprises a second section connected to the first section by a deflectable beam; and connecting the second section to a second member of the receptacle shield housing, where the heat sink and first section are movable relative to the second member in a general cantilever fashion by deflection of the deflectable beam.

In accordance with another aspect, a method comprises inserting a plug into a receptacle, where the receptacle comprises a heat sink connected to a member of the shield housing, where the member comprises a deflectable beam; and moving the heat sink by the plug as the plug is inserted into the receptacle, where the deflectable beam deflects in a general cantilever fashion as the heat sink is moved by the plug to allow the heat sink to deflect outward.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
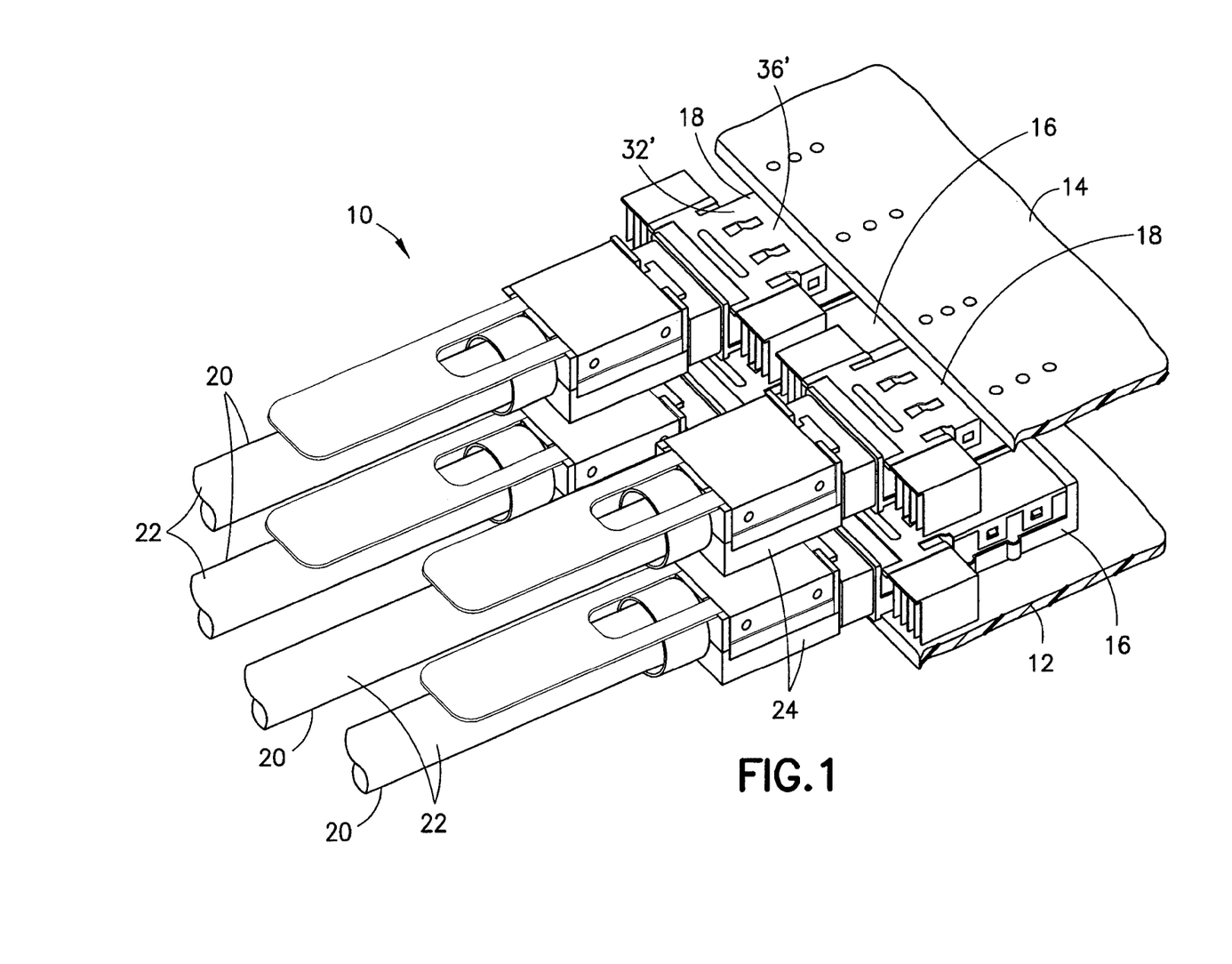
FIG. 1 is a perspective view of an assembly comprise example embodiments.

Referring to FIG. 1, there is shown a perspective view of an assembly 10 incorporating features of example embodiments. Although the features will be described with reference to the example embodiments shown in the drawings, it should be understood that features can be embodied in many alternate forms of embodiments. In addition, any suitable size, shape or type of elements or materials could be used.

The assembly 10 comprises printed circuit boards 12, 14, such as a mother printed circuit board and a daughter printed circuit board for example, receptacles 16, 18, and cable assemblies 20. More or less than two printed circuit boards could be provided, and one or more of the receptacles could be attached to a different type of electrical component. The cable assemblies 20, in this example, each comprise a passive optical cable assembly 22 connected to an active optical cable assembly 24. The active optical cable assembly 24 may comprise an optical transducer for example. The front end of each of the active optical cable assemblies 24 is configured as a plug to be removably connected to one of the receptacles 16, 18. However, in alternate embodiments any suitable component could be provided which is connected to the receptacles 16, 18.

Figure 2:
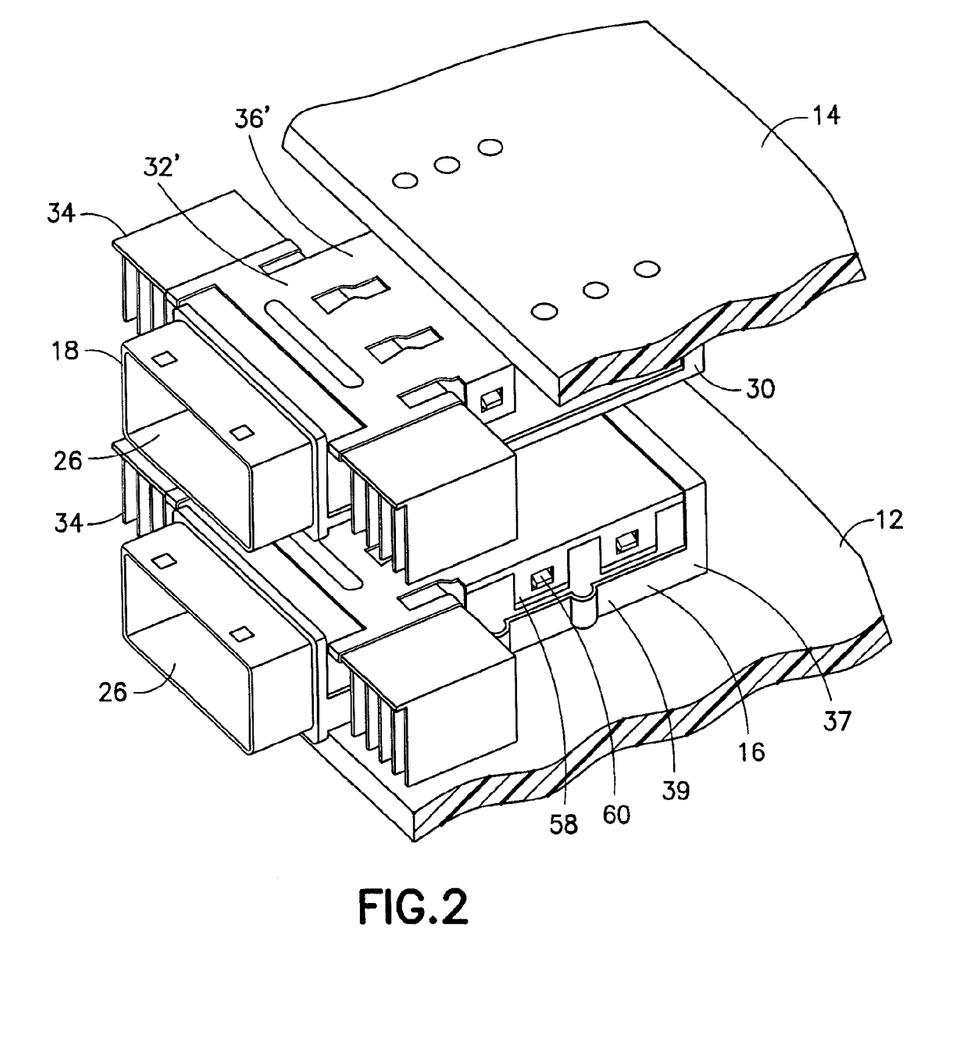
FIG. 2 is a partial enlarged perspective view of some of the components of the assembly shown in FIG. 1.

In this example the receptacles comprise two first receptacles 16 which are attached to a top side of the mother printed circuit board 12, and two second receptacles 18 which are attached to a bottom side of the daughter printed circuit board 14. However in alternate embodiments more or less than four receptacles could be provided, and more or less than two types of the receptacles could be provided. Referring also to FIG. 2, only two of the receptacles are shown enlarged. In this example the receptacles 16, 18 are each provided as an integrated cage and heat sink assembly. Each receptacle 16, 18 has an open front end 26 for receiving a front end of one of the active optical cable assemblies 24. The cage portion of the assembly forms a shield housing comprising a first member 36 and a second member 37.

Figure 12:
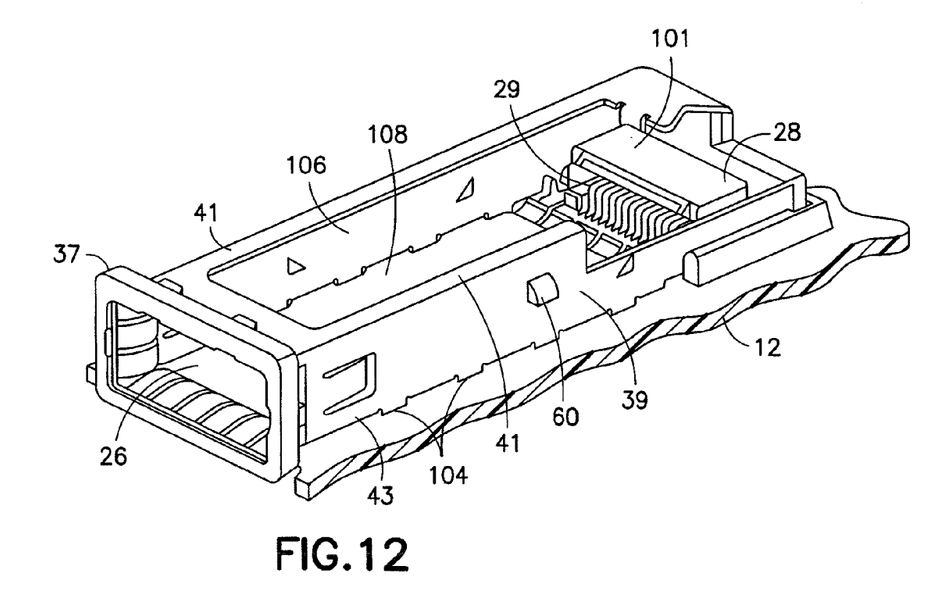
FIG. 12 is a perspective view of the main cage member of one of the receptacles shown in FIG. 2 on the mother printed circuit board with a cut-away section to shown the electrical connector in more detail.

Referring also to FIG. 12, the second member 37 is shown on the mother printed circuit board 12 with a partial cut away section. A conventional electrical connector 101 is provided on the mother printed circuit board 12 which is surrounded by the second member 37. The connector 101 comprises a housing 28 and electrical contacts 29 connected to the mother board 12. The second member 37 forms a main cage member. The main cage member forms the aperture 26 for receiving the front plug of one of the assemblies 24. The main cage member has posts 104 which are located in holes of the mother board 12. The main cage member has a top open aperture 106 into a receiving area 108. The electrical connector 101 is located at a rear of the receiving area 108. The clip 36 can be attached to tabs 60 at the lateral sides 39 of the main cage member 37, and the clip 36 can substantially close the top open aperture 106; locating the heat sink 34 at the front of the top open aperture 106.

In this example the electrical contacts 29 have solder tails which extend from a bottom side of the housing 28 and are mounted in holes of the mother printed circuit board 12. The second receptacle 18 has a second cage member 30. In this example the electrical contacts of a second connector in the second cage member 30 have solder tails which extend from a top side of the second cage member 30 and are mounted in holes at a bottom side of the daughter printed circuit board 14.

Figure 3:
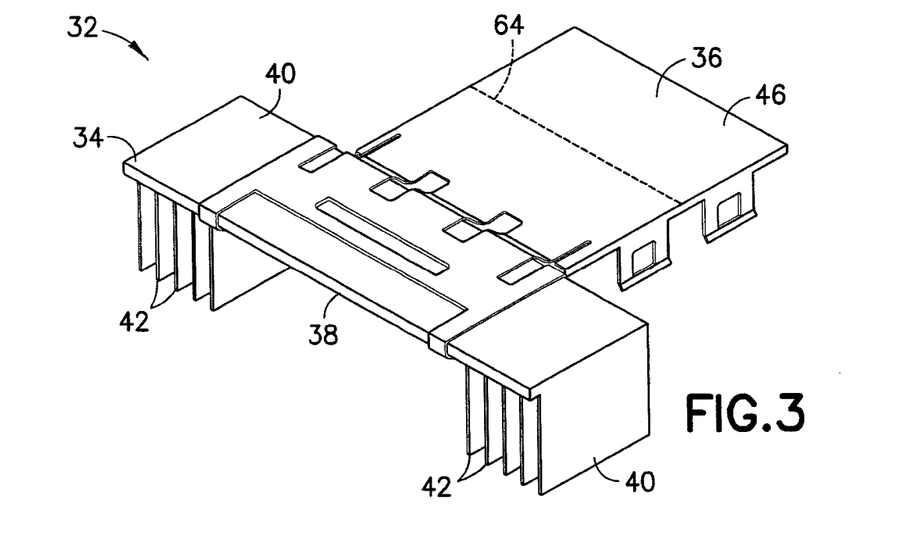
FIG. 3 is a perspective view of a subassembly of one of the receptacles shown in FIGS. 1-2.
Figure 4:
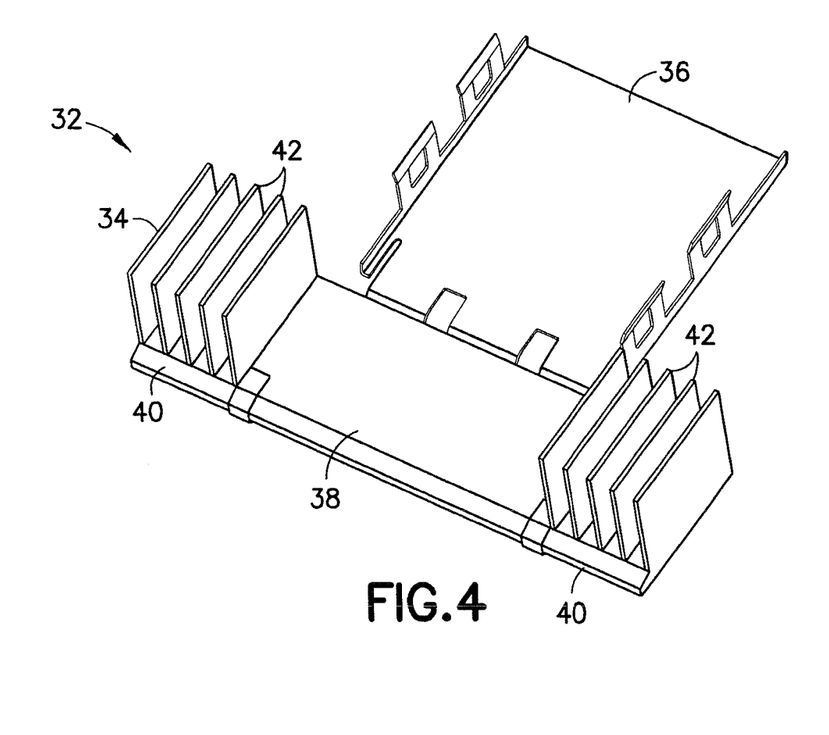
FIG. 4 is a perspective view of the assembly shown in FIG. 3 from a different direction.
Figure 5:
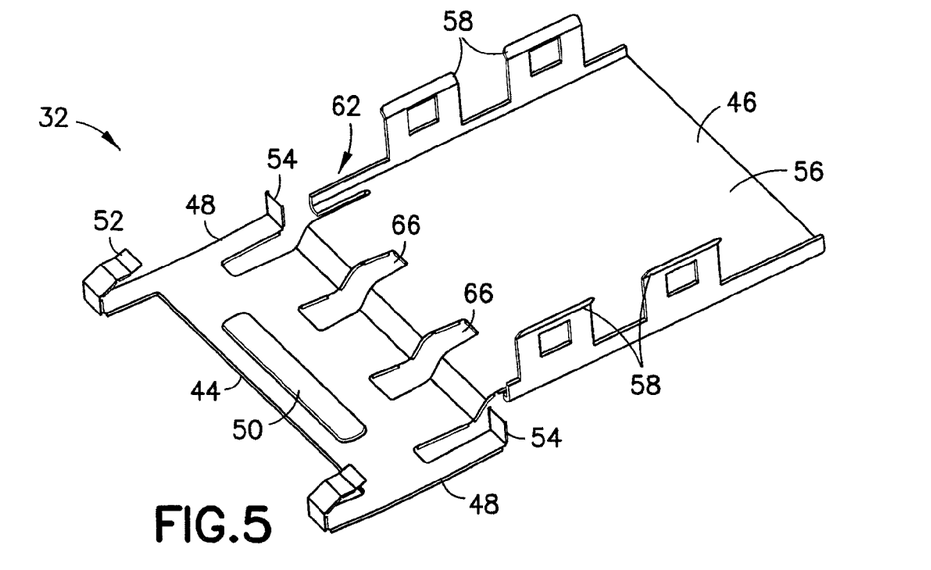
FIG. 5 is a perspective view of a member of the subassembly shown in FIGS. 3-4.
Figure 6:
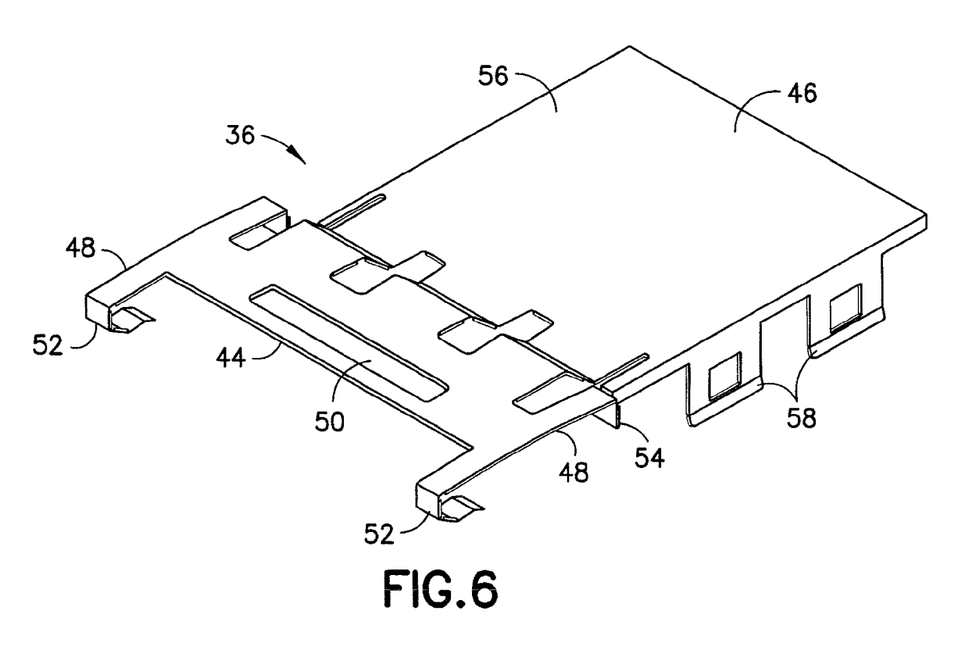
FIG. 6 is a perspective view of the member shown in FIG. 5 from a different direction.
Figure 7:
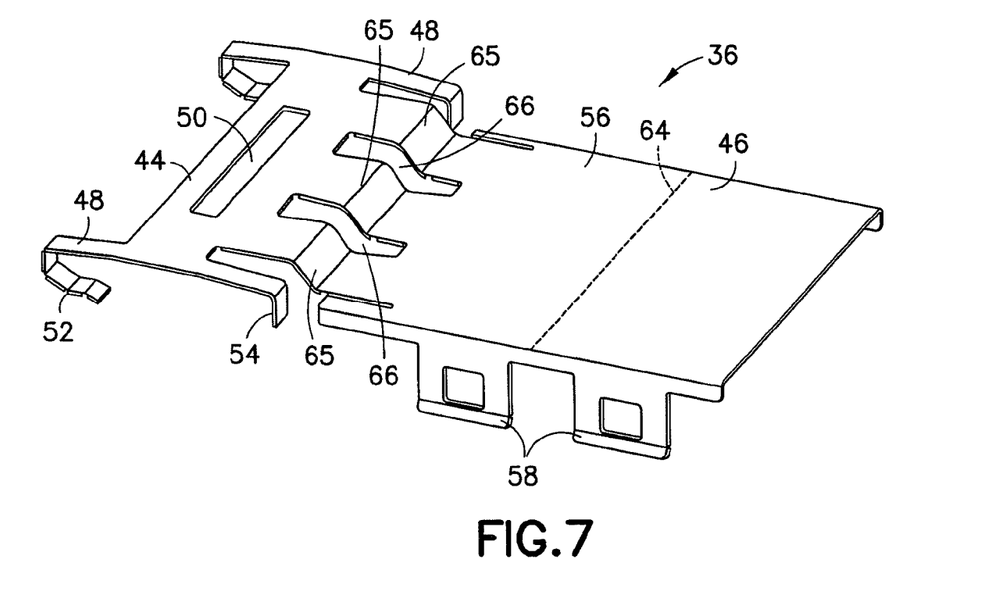
FIG. 7 is a perspective view of the member shown in FIGS. 5-6 from a different direction.
Figure 8:
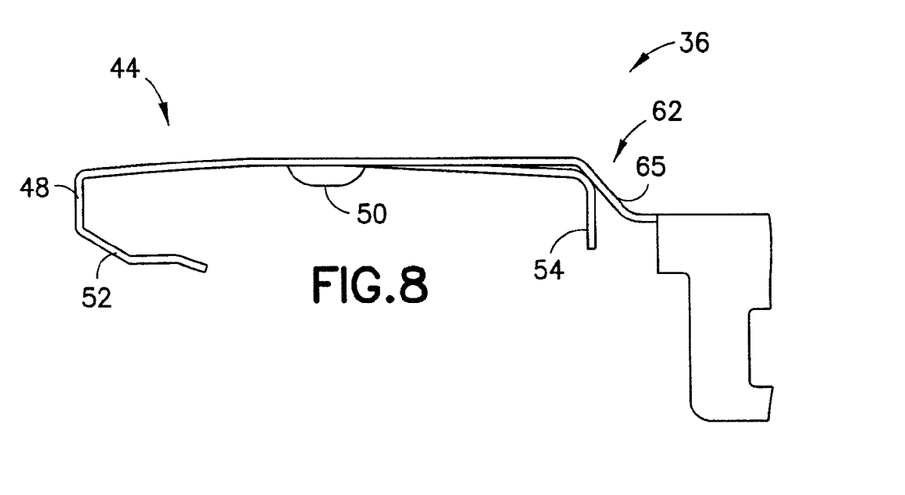
FIG. 8 is a side view of the front of the member shown in FIGS. 5-7.

Referring also to FIGS. 3-4, the mother board receptacles 16 each comprise a subassembly 32 comprising a heat sink 34 and the member 36. The heat sink 34, in this example, is a one piece member having a center section 38 and two lateral end sections 40. The center section 38 has a general flat beam shape. The lateral end sections 40 comprise downward extending heat transfer fins 42. However, in alternate embodiments different shapes could be provided for the heat sink, and the heat sink might comprise multiple members. The lateral end sections 40, when the subassembly 32 is connected to the second member 37, extend along the lateral sides 39 of the second member 37 from the first side 41 towards the opposite second side 43 (see FIGS. 1, 2 and 12).

Referring also to FIG. 5-8, the member 36 is a one-piece member preferably comprised of sheet metal. The member has two primary functions; as a mechanical connector to connect the heat sink 34 to the second member 37, and as at least part of a shielding cage for the receptacle 16. The member 36 comprises a front section 44 and a rear section 46. The front section 44 is adapted to attach to the center section 38 of the heat sink 34. The front section 44 comprises lateral ends forming heat sink straps 48 and a contact boss 50. The straps 48 each comprise a front hook 52 and a rear tab 54. The heat sink straps contain or hold the heat sink during operation. The member 36 is adapted to keep the heat sink from binding during mating and un-mating of the plug section of the assembly 24 by controlling the location of the heat sink in all directions. When the member 36 is mated to the heat sink, the straps 48 can limit the left and right movement of the heat sink 34 on the member 36 by stopping on the fins 42 or other protruding feature. The heat sink hook 52 locates the heat sink in the forward and downward directions by wrapping around the front edge of the heat sink. The rear heat sink tab 54 locates or positions the heat sink in the back direction. The stiffness of the straps might only be enough to contain and orient the heat sink. They are not intended to provide the required normal force.

Insertion of the front plug end of one of the assemblies 24 into one of the receptacles 16, 18 caused the assembly 24 to contact the heat sink 34. Thus, the heat sink can help to remove heat from the active component in the assembly 24. The heat sink 34 can be pushed upward relative to the main cage member 37 by the inserted front plug end of the assembly 24. The member 36 or 36' can allow the heat sink 34 to resiliently move upward relative to the main cage member 37, but still remain attached to the main cage member 37. The contact boss 50 provides a constant contact point during the mating cycle.

The rounded feature at the bottom side of the contact boss 50 allows the heat sink 34 to pivot during installation of the front plug end of the assembly 24 and allows for easier insertion of the front plug end of the assembly 24. Thus, the heat sink 34 is able to tilt relative to the clip 36 on the boss 50. This type of adjustability of the heat sink 34 on the boss 50 can help to prevent binding of the heat sink with the front plug end of the assembly 24 as the assembly is inserted. The front edge of the heat sink 34 has a tapered shape to allow the assembly 24 to ramp the front of the heat sink upward as the assembly 24 is inserted. The back end of the heat sink can move up and down against the tabs 54 as the heat sink 34 pivots on the bottom of the boss 50, and the entire front section 44 also deflects upward as well; the beams 65 bending to allow this motion.

The rear section 46 has a main part 56 which sits on the top side 41 of the member 37 and snap lock latches or tabs 58 extending downward from the main part 56. The latches 58 are configured to snap onto projections 60 on the side of the member 37 (see FIGS. 2 and 12) to stationarily latch the rear section 46 of the member 36 to the member 37. In an alternate embodiment any suitable type of connection could be provided.

In the example embodiment shown, the front and rear sections of the member 36 are connected to each other by a center section 62. The center section 62 comprises at least one beam 65. The example embodiment shows three of the beams 65 and holes 66 between the beams. The beam(s) 65 provide the normal force for the heat sink. The size and shape of the holes 66 can be customized to provide a normal force customizing feature where the holes are used as a feature to dial-in or adjust normal force and stress of the assembly. The shape and size can vary to meet the specific needs.

Referring back to FIGS. 1-2, the daughter board receptacles 18 each comprise a main cage member 30 and a subassembly 32'. The main cage member 30 is similar to the main cage member 37. However, the main cage member 30 has a substantially closed bottom side and an opening through its top side. The front of the opening in the top side is covered by the subassembly 32'. The rear of the opening in the top side is a location which an electrical connector, such as 101 for example, is mounted to the underside of the daughter printed circuit board 14. The top side of the main cage member 30 comprises mounting posts which extend into holes through the bottom side of the daughter printed circuit board to mechanically attach the main cage member 30 to the board, and electrically connect the main cage member to a ground in the board.

Figure 9:
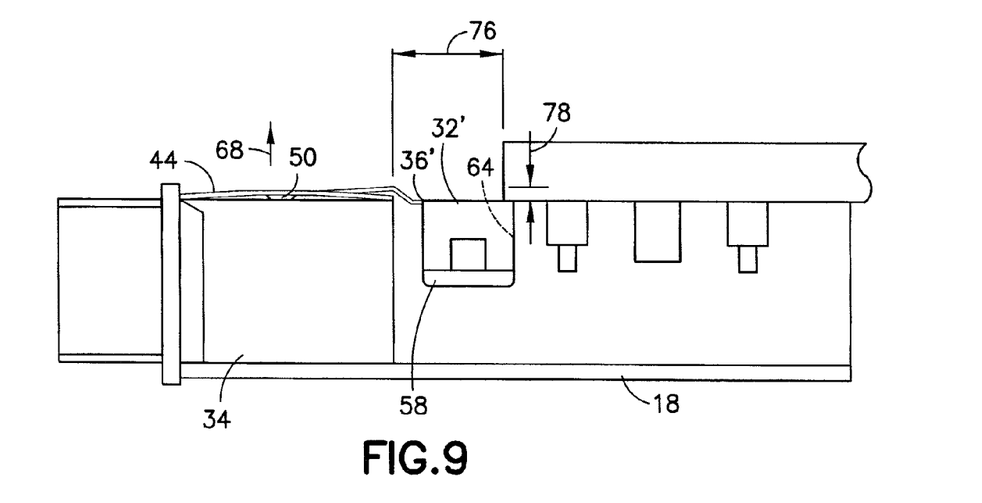
FIG. 9 is a side view of one of the receptacles shown in FIGS. 1-2 on the daughter printed circuit board.

The subassembly 32' comprises a heat sink 34 and a member 36'. The subassembly 32' is identical to the subassembly 32 except the subassembly 32' has the member 36' rather than the member 36. Referring particularly to FIG. 3, the member 36' is identical to the member 36 except a rear part of the rear section 46 has been removed at line 64. Thus, the rear section of the member 36' only has one latch 58 at each lateral side as shown in FIG. 9. Otherwise, the front section 44 and center section 62 are the same for the member 36'.

With particular reference to FIG. 9, arrow 68 illustrated that the heat sink 34 can float up and down on the receptacle 18. Likewise the heats sinks 34 can float on the receptacles 16. The float is made possible by the connection provided by the members 36, 36'. The front section 44 can move relative to the rear section 46 of the member 36, 36' by resilient deflection of the beam(s) 65 of the center section 62. Thus, the member 36 or 36' acts as a cantilevered leaf spring to allow the heat sink to be moved during connection of the plug section of the assembly 24.

With the example described above, a clip can be provided as part of the shielding cage to hold a heat sink on a CXP connector for example. The clip can locate the heat sink, provide a specified amount of normal force, provide enough travel to allow mating to the plug 24, be able to be installed upside down, and use as much of a standard product as possible. The result is a concept that allows ample deflection and normal force to the heat sink while capturing and retaining the heat sink. This concept has features that allows a manufacturer to tailor the normal force to the application. The members 36 and 36' are adapted to keep the heat sinks from binding during mating and un-mating of the plugs of the assemblies 24 by allowing the heat sinks to move as they are contacted by the assemblies 24 and controlling the location of the heat sinks in all directions as the heat sinks are moved.

Figure 10:
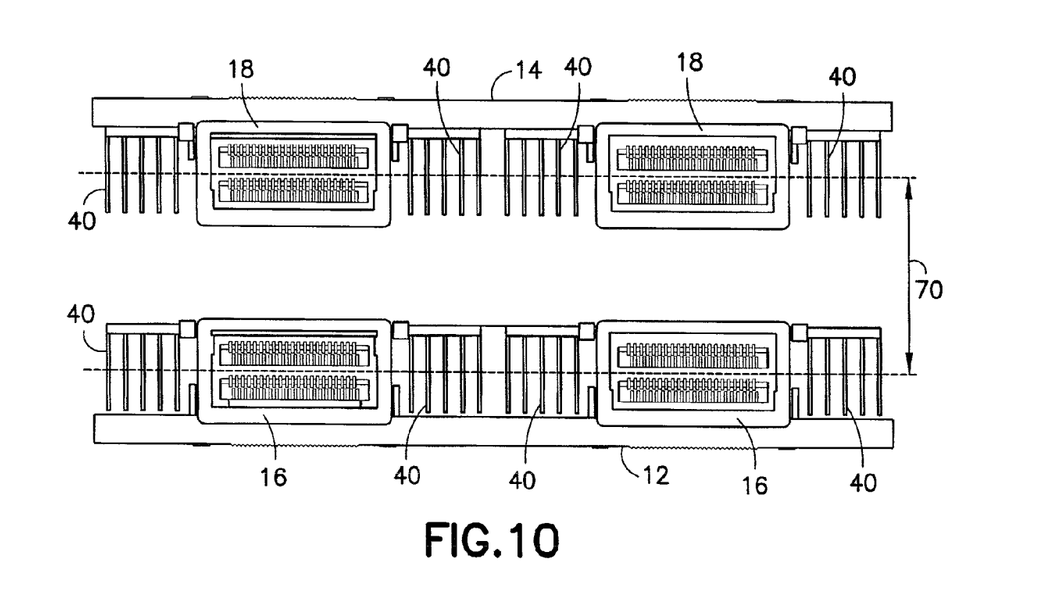
FIG. 10 is a front view of the assembly shown in FIG. 1 without the cable assemblies connected.
Figure 11:
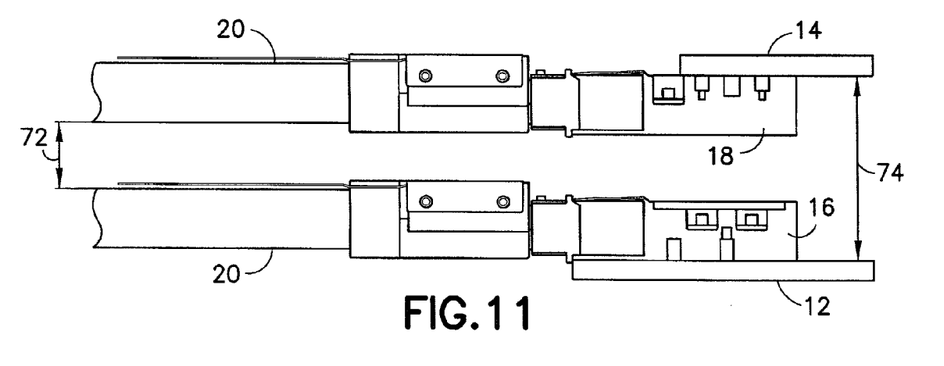
FIG. 11 is a side view of the assembly shown in FIG. 1.

In one type of example as illustrated in FIG. 10, the distance 70 might be about 26 mm. In this example the distance 72 as shown in FIG. 11 might be about 9.9 mm and the distance 74 might be about 38 mm. As shown in FIG. 9, the distance 76 between the end of the printed circuit board and the heat sink might be reduced to about 4 mm where it is about 7.5 mm in a conventional design. Also, with an example embodiment the float distance 78 might provide a total clearance from the printed circuit board surface of about 1.35 mm of clearance (0.60 mm initial height +0.75 mm float). These dimensions are merely for one example. The dimensions can be different in different embodiments.

With an example embodiment of the invention, a communications connector (such as an optical or electrical connector) can be provided comprising an electrical connector having a housing and electrical contacts, and a receptacle comprising a cage and a heat sink, where a member of the cage connects the heat sink to the cage. The member is configured to allow the heat sink to move relative to the cage during connection of a mating connector or plug to the communications connector.

In the examples described above the lateral end sections 40 of the heat sink can extend outward past the lateral sides of the main cage member. Thus, a majority of the heat sink can be located other than directly above the main cage member. Thus, although the lateral footprint is larger, the vertical footprint can be smaller. In addition, although the examples described above have the heat transfer fins 42 hanging down, in an alternate embodiment the heat transfer fins could alternatively or additionally project upward. The heat sink 34 could be attached to the clip 36 shown in FIG. 3 upside-down from what is shown, and the center section 38 could include upward extending heat transfer fins also. The assembly 32 is described as being attached to a top side of the main cage. In an alternate embodiment the assembly 32 could be attached to a bottom side of a main cage, such as having the heat transfer fins then projection upward.

In one example a receptacle 16 or 18 is provided comprising:
a shield housing having a first side configured to be connected to a printed circuit board, where the housing comprises an aperture 26 for insertion of a plug 24 of a cable assembly 20; and
a heat sink 34 connected to the first side 41 or an opposite second side 43 of the shield housing, where the heat sink has at least one lateral end section 40 which extends along an exterior of a least one lateral side of the shield housing between the first and second sides.

The heat sink can comprise two of the lateral end sections 40, where each of the lateral end sections extends along the exterior of two opposite ones of the lateral sides of the shield housing. A center section 38 of the heat sink can extend along the first side or the opposite second side of the shield housing between the lateral sides of the shield housing. The heat sink can be connected to a first section 44 of a member 36 of the shield housing, where the first section is connected to a second section 46 of the member by a deflectable beam 65 such that the first section and heat sink can move in a general cantilever fashion relative to the second section. The second section 46 can be sized and shaped to be clipped onto a second member 37 of the shield housing. The heat sink can be clipped into the first section 44 and located against a contact boss 50 of the first section such that the heat sink is able to pivot at the first section on the contact boss. The heat sink can be connected to a first section 44 of a member of the shield housing, where the heat sink is clipped into the first section and is located against a contact boss 50 of the first section such that the heat sink is able to pivot at the first section on the contact boss. The shield housing can comprise a first member 36 with the heat sink connected thereto and a second member 37 forming the aperture 26 and having an opening 106 in a side of the second member, where the first member and the heat sink are provided as a subassembly 32 which is sized and shaped to be connected to the second member as a unitary member, where a center section of the heat sink is located at the opening, and where a portion of the first member is located at an opposite side of the center section of the heat sink from the opening. The receptacle may comprise means for allowing the heat sink to move relative to the shield housing, where the means for allowing the heat sink to move comprises the heat sink being connected to a cantilever deflectable section of the shield housing and the heat sink being located on a pivot boss of the section of the shield housing such that the heat sink can both move outward on the shield housing due to general cantilevered deflection of the cantilever deflectable section as well as pivot on the section of the shield housing.

In one example a receptacle may be provided comprising:
a shield housing configured to be connected to a printed circuit board, where the shield housing comprises an aperture 26 for insertion of a plug 24 of a cable assembly 20, where the shield housing comprises a member 36 with a front section 44 connected to a rear section 46 by a deflectable beam 65; and
a heat sink 34 connected to the front section of the member, where the heat sink is movable on the shield housing by general cantilevered deflection of the deflection beam relative to the rear section.

The rear section may be clipped onto a second member 37 of the shield housing. The heat sink 34 may be movably connected to the front section 44 on a pivot 50 such that the heat sink can pivot on the front section. The heat sink may comprise a center section 38 connected to the front section 44, and two lateral side sections 40 extending along opposite lateral sides of the shield housing. The front section 44 may comprise a front hook 52 which extends around a front edge of the heat sink, and a rear tab 54 which extends along and past a rear edge of the heat sink.

One example method might comprise:
connecting a heat sink 34 to a first section 44 of a member 36 of a receptacle shield housing, where the member comprises a second section 46 connected to the first section by a deflectable beam 65; and
connecting the second section 46 to a second member 37 of the receptacle shield housing, where the heat sink and first section are movable relative to the second member in a general cantilever fashion by deflection of the deflectable beam.

Connecting the second section 46 to the second member 37 may comprise locating lateral end sections 40 of the heat sink along opposite lateral side of the shield housing. Connecting the heat sink 34 to the first section 44 may comprise mounting the heat sink on the first section such that heat sink can pivot relative to the first section. Connecting the second section 46 to the second member 37 may comprise clipping the second section to the second member where the heat sink and the member are connected to the second member as a unitary subassembly.

One example method might comprise:
inserting a plug 24 into a receptacle 16, where the receptacle comprises a heat sink 334 connected to a member 36 of the shield housing, where the member comprises a deflectable beam 65; and
moving the heat sink 34 by the plug 24 as the plug is inserted into the receptacle, where the deflectable beam deflects in a general cantilever fashion as the heat sink is moved by the plug to allow the heat sink to deflect outward.

Moving the heat sink by the plug may further comprise the heat sink pivoting on the member 36 of the shield housing as the heat sink is deflected outward.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A receptacle comprising:
a shield housing having a first side configured to be connected to a printed circuit board, where the shield housing comprises an aperture for insertion of a plug of a cable assembly; and
a heat sink connected to the first side or an opposite second side of the shield housing, where the heat sink has at least one lateral end section which extends along an exterior of a least one lateral side of the shield housing, where the heat sink is connected to a first section of a member of the shield housing, where the heat sink is clipped into the first section and is located against a contact boss of the first section such that the heat sink is able to pivot at the first section on the contact boss.

2. A receptacle as in claim 1 where the heat sink comprises two of the lateral end sections, where each of the lateral end sections extends along the exterior of two opposite ones of the lateral sides of the shield housing.

3. A receptacle as in claim 1 where a center section of the heat sink extends along the first side or the opposite second side of the shield housing between the lateral sides of the shield housing.

4. A receptacle as in claim 1 where the first section is connected to a second section of the member by a deflectable beam such that the first section and the heat sink can move in a general cantilever fashion relative to the second section.

5. A receptacle as in claim 4 where the second section is sized and shaped to be snap-lock mounted onto a second member of the shield housing.

6. A receptacle as in claim 1 where the shield housing comprises the member, and a second member forming the aperture and having an opening in a side of the second member, where the member and the heat sink are provided as a subassembly which is sized and shaped to be connected to the second member as a unitary member, where a first side of a center section of the heat sink is located at the opening, and where a portion of the member is located at an opposite second side of the center section of the heat sink.

7. A receptacle as in claim 1 further comprising a deflectable beam for allowing the heat sink to move relative to the shield housing.

8. A receptacle comprising:
a shield housing having a first side configured to be connected to a printed circuit board, where the shield housing comprises an aperture for insertion of a plug of a cable assembly; and
a heat sink connected to the first side or an opposite second side of the shield housing,
where the heat sink is connected to a first section of a member of the shield housing, and where the heat sink is clipped into the first section and is located against a contact boss of the first section such that the heat sink is able to pivot at the first section on the contact boss.

9. A receptacle comprising:
a shield housing configured to be connected to a printed circuit board, where the shield housing comprises an aperture for insertion of a plug of a cable assembly, where the shield housing comprises a member with a front section connected to a rear section by a deflectable beam; and
a heat sink connected to the front section of the member, where the heat sink is movable on the shield housing by general cantilevered deflection of the deflection beam relative to the rear section, where the front section comprises a front hook which extends around a front edge of the heat sink, and a rear tab which extends along and past a rear edge of the heat sink.

10. A receptacle as in claim 9 where the rear section is clipped onto a second member of the shield housing.

11. A receptacle as in claim 9 where the heat sink is movably connected to the front section on a pivot such that the heat sink can pivot on the front section.

12. A receptacle as in claim 9 where the heat sink comprises a center section connected to the front section, and two lateral side sections extending along opposite lateral sides of the shield housing.

13. A method comprising:
connecting a heat sink to a first section of a member of a receptacle shield housing, where the member comprises a second section connected to the first section by a deflectable beam, where the heat sink is located against a contact boss of the first section such that the heat sink is able to pivot at the first section on the contact boss; and
connecting the second section to a second member of the receptacle shield housing, where the heat sink and first section are movable relative to the second member in a general cantilever fashion by deflection of the deflectable beam.

14. A method as in claim 13 where connecting the second section to the second member comprises locating lateral end sections of the heat sink along opposite lateral side of the shield housing.

15. A method as in claim 13 where connecting the second section to the second member comprises clipping the second section to the second member, where the heat sink and the member are connected to the second member as a unitary subassembly.

16. A method comprising:
- inserting a plug into a receptacle, where the receptacle comprises a heat sink connected to a member of a shield housing, where the member comprises a deflectable beam; and
- moving the heat sink by the plug as the plug is inserted into the receptacle, where the deflectable beam deflects in a general cantilever fashion as the heat sink is moved by the plug to allow the heat sink to deflect outward, and where the heat sink pivots on a contact boss of the shield housing as the heat sink is deflected outward.

* * * * *